United States Patent [19]

Fraas et al.

[11] 4,128,733
[45] Dec. 5, 1978

[54] MULTIJUNCTION GALLIUM ALUMINUM ARSENIDE-GALLIUM ARSENIDE-GERMANIUM SOLAR CELL AND PROCESS FOR FABRICATING SAME

[75] Inventors: Lewis M. Fraas, Malibu; Kenneth R. Zanio, Agoura; Ronald C. Knechtli, Woodland Hills, all of Calif.

[73] Assignee: Hughes Aircraft Company, Culver City, Calif.

[21] Appl. No.: 864,300

[22] Filed: Dec. 27, 1977

[51] Int. Cl.² .................................................. H01L 31/06
[52] U.S. Cl. ............................... 136/89 SJ; 148/174; 148/175; 357/16; 357/30; 357/58
[58] Field of Search .................. 136/89 SJ, 89 SG; 148/174, 175; 29/572; 357/12, 16, 30, 58, 61, 86

[56] References Cited

U.S. PATENT DOCUMENTS

| 3,368,125 | 2/1968 | Pasierb | 317/237 |
| 3,376,163 | 4/1968 | Abrahamsohn | 136/89 |
| 3,990,101 | 11/1976 | Ettenberg et al. | 357/30 |
| 4,017,332 | 4/1977 | James | 136/89 |
| 4,072,541 | 2/1978 | Meulenberg, Jr. et al. | 136/89 SJ |

*Primary Examiner*—John H. Mack
*Assistant Examiner*—Aaron Weisstuch
*Attorney, Agent, or Firm*—William J. Bethurum; W. H. MacAllister

[57] ABSTRACT

The specification describes a gallium aluminum arsenide-gallium arsenide-germanium solar cell and fabrication process therefor wherein the deposition of a layer of gallium aluminum arsenide establishes a first PN junction in the GaAs of one bandgap energy on one side of a gallium arsenide substrate, and the deposition of a layer of germanium establishes a second PN junction in Ge of a different bandgap energy on the other side of the GaAs substrate. The two PN junctions are responsive respectively to different wavelength ranges of solar energy to thus enhance the power output capability of a single wafer (substrate) solar cell. Utilization of the Group IV element germanium, as contrasted to compound semiconductors, simplifies the process control requirements relative to known prior art compound semiconductor processes, and germanium also provides a good crystal lattice match with gallium arsenide and thereby maximizes process yields. This latter feature also minimizes losses caused by the crystal defects associated with the interface between two semiconductors.

8 Claims, 10 Drawing Figures

MULTIJUNCTION GALLIUM ALUMINUM ARSENIDE-GALLIUM ARSENIDE-GERMANIUM SOLAR CELL AND PROCESS FOR FABRICATING SAME

FIELD OF THE INVENTION

This invention relates generally to semiconductor solar cells and related manufacturing processes and more particularly to a single wafer multi-junction solar cell including a Group IV elemental semiconductor and a Group III-V compound semiconductor to form a heteroface structure.

BACKGROUND

Recent efforts to improve the electrical performance of both silicon and III-V compound semiconductor solar cells are well-known and well documented. Gallium arsenide-gallium aluminum arsenide solar cells have recently been described by J. d'Beau in an article entitled "From Photons to Kilowatts: Can Solar Technology Deliver?" *Electronics*, Nov. 11, 1976, on pages 86–90. See also J. M. Woodall et al., *Applied Physics Letters*, 30, 492 (1977). Efforts in this solar cell technology include, among other things, attempts to increase the solar cell conversion efficiency, and one approach to this problem has been the utilization of stacked or tandem connected semiconductor wafers in a structure responsive to different wavelength ranges of sunlight. Ideally, solar cells fabricated by stacking separate wafers will have PN junctions with different bandgap energies which are responsive to different wavelength ranges in the electromagnetic wavelength spectrum. These PN junctions will generate a combined power output which is greater than the individual power outputs from the individual PN junctions. One problem with this first approach to increasing solar cell efficiency is that two semiconductor wafers are approximately twice as heavy and twice as expensive as one and therefore make this stacked wafer approach unacceptable for certain light weight spacecraft applications. Alternately, if this first approach is used in terrestrial applications in combination with high concentration ratio optical systems, it also presents severe cell cooling problems.

A second approach to the problem of increasing the efficiency and output power of solar cells is to epitaxially grow multiple layers of different III-V semiconductor compound materials vertically upward from one surface of a suitable substrate material. The difficulty with this latter approach resides in the very high degree of process control required for growing multiple III-V compound epitaxial semiconductor layers of different materials atop a single substrate starting material. Not only is this latter process approach inherently disadvantageous from the standpoint of achievable process yields and fabrication costs; it also suffers from the limitation that the multiple epitaxial layers grown atop a single substrate surface are inherently inaccessible to contacts from both sides of each individual PN junction.

THE INVENTION

The general purpose of this invention is to provide a new and improved heteroface semiconductor solar cell and fabrication process therefor which provides the desired bandgap separation for multiple PN junctions and a good crystal lattice match for grown epitaxial layers. In addition, our process simultaneously eliminates the above-described cost-weight problems associated with multiple wafer solar cells and also solves the process control and layer accessibility problems associated with certain multiple epitaxial layer solar cells and related fabrication processes. Thus, our process provides a substantial improvement in process yields when compared to known prior art processes, while providing acceptable electrical characteristics and an improved conversion efficiency in the resultant solar cells.

To accomplish this purpose, we have discovered and developed a double junction Group IV semiconductor-Group III-V semiconductor solar cell which includes a gallium arsenide substrate having an outer III-V compound semiconductor layer thereon establishing a first PN junction with a first bandgap energy corresponding to GaAs and responsive to one wavelength range in the electromagnetic wavelength spectrum. An intermediate semiconductor layer (or layers) is disposed on the opposite side of the gallium arsenide substrate and has a chosen impurity concentration and crystal lattice match for adjacent layers. Another outer layer (or layers) of germanium is disposed on the intermediate semiconductor layer to thereby establish a second PN junction with a second bandgap energy corresponding to Ge. These two PN junctions may be either connected in series through a doped conductive gallium arsenide substrate or electrically isolated by an intrinsic or insulating gallium arsenide substrate, but in both cases these PN junctions are responsive to different wavelength ranges of solar energy to optimize the power conversion efficiency of the solar cell.

In one embodiment of the invention, the first named outer semiconductor layer is gallium aluminum arsenide and the substrate is intrinsic or very high resistivity, e.g. chromium doped gallium arsenide, with a conductively doped gallium arsenide layer between it and the gallium aluminum arsenide layer to form the first PN junction in this conductive GaAs layer. A layer of germanium is disposed above the opposite surface of the gallium arsenide substrate to form within this Ge layer the second PN junction of the device which is electrically isolated from the first PN junction. Separate contacts are provided to each of these two PN junctions.

In another embodiment of the invention, the substrate is N-type gallium arsenide which includes the first PN junction in the GaAs and directly adjacent an outer layer of gallium aluminum arsenide. Two layers of germanium are disposed above the opposite side of this substrate and atop intermediate heavily doped GaAs layers of the structure adjacent to the substrate to thereby form in the Ge a second PN junction of the device which is connected electrically in series with the first PN junction.

Accordingly, it is an object of the present invention to provide a new and improved double junction solar cell and fabrication process therefor.

Another object is to provide a new and improved double junction solar cell of the type described with an enhanced power conversion efficiency and with a minimum of additional fabrication cost in the treatment of state-of-the-art single junction wafers.

Another object is to provide a new and improved solar cell of the type described having good crystal lattice match characteristics.

Another object is to provide a new and improved process of the type described wherein rigid process control requirements have been relaxed relative to existent III-V ternary and quaternary multiple epitaxial semiconductor processes.

Another object is to provide a new and improved process of the type described which exhibits improved fabrication yields.

Another object is to provide a new and improved fabrication process of the type described which may be carried out by treating existing single junction solar cell structures.

A feature of this invention is the provision of a novel low temperature process for adding a second, auxiliary junction to existing single junction structures, thereby obviating any temperature related damage to these existing structures.

Another feature of this invention is the provision of a germanium-gallium arsenide heteroface solar cell wherein two PN junctions of different bandgaps are fabricated on a single gallium arsenide substrate.

Another feature of this invention is the provision of a Group IV semiconductor-Group III-V semiconductor solar cell wherein separate PN junctions thereof may either be electrically isolated and suitable for independent electrical connection or the like, or may be electrically fabricated in a series electrical connection.

These and other objects and features of this invention will become more readily apparent in the following description of the accompanying drawings.

DRAWINGS

FIGS. 1a to 1d schematically illustrate one solar cell fabrication process according to the invention.

FIGS. 2a to 2d schematically illustrate another solar cell fabrication process according to the invention.

FIG. 3b is an enlarged view of one of the pyrolytic reaction chambers in FIG. 3a.

PREFERRED EMBODIMENTS

Figure 1A:
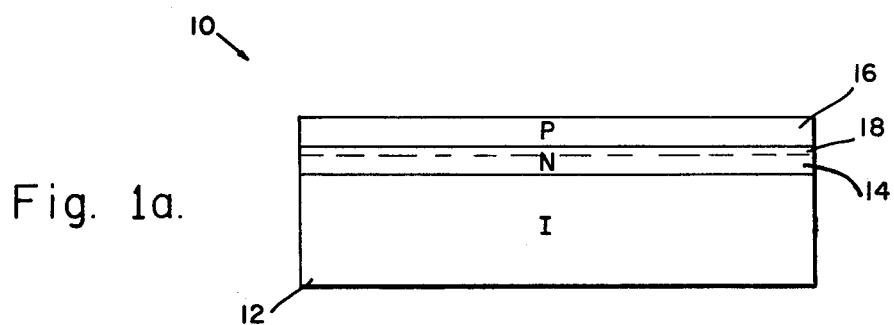

Referring now to the embodiment of the invention illustrated in FIGS. 1a-1d, there is shown in FIG. 1a a single wafer and single junction semiconductor structure 10 which includes a gallium arsenide substrate material consisting of an intrinsic gallium arsenide semiconductor region 12 and a thin layer of N type epitaxial gallium arsenide 14 on one surface thereof. An outer P type layer 16 of gallium aluminum arsenide is epitaxially deposited on the N type layer 14 to thus establish a first PN junction 18 of one bandgap energy inside the GaAs layer 14 on one side of the structure 10. It is of course within the scope of the present invention to begin the process with a gallium arsenide intrinsic substrate material 12 and build up epitaxial layers 14 and 16 thereon. However, since single wafer-single junction structures are generally well-known and have themselves been fabricated using existant and known GaAs epitaxial technology, the structure 10 shown in FIG. 1a is treated as the starting material for purposes of the present process description. Single-junction single-wafer structures such as those shown in both FIGS. 1a and 2a are presently available at Hughes Research Laboratories in Malibu, California. They will also soon be commercially available from the Spectrolab subsidiary of the Hughes Aircraft Company, located in Sylmar, California.

Figure 1B:
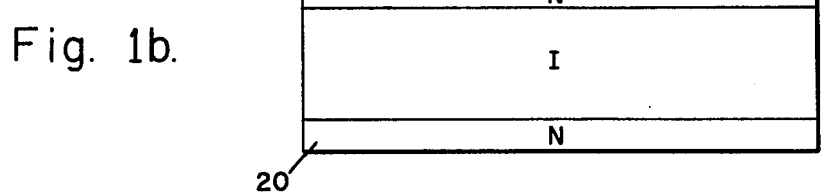
Figure 2A:
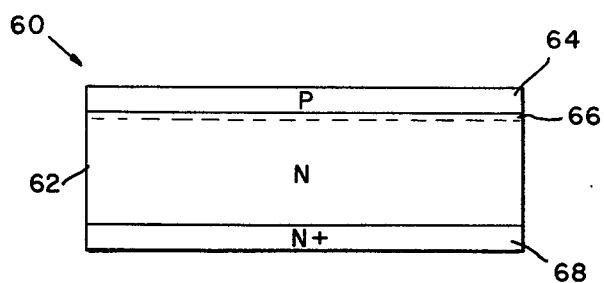

Referring now to FIG. 1b, an N type epitaxial layer 20 of gallium arsenide is deposited on the reverse surface of the intrinsic semiconductor material 12, and the deposition of layer 20 may be carried out, for example, using either the liquid phase epitaxial (LPE) crystal growth process disclosed by G. S. Kamath et al. in U.S. Pat. No. 4,026,735, assigned to the present assignee (hereinafter the Kamath process) or the planar reactive deposition (PRD) process described in our U.S. Pat. No. 4,063,974. This latter application is entitled "Planar Reactive Evaporation Method For the Deposition of Compound Semiconducting Films," filed Nov. 14, 1975, and is also assigned to the present assignee. Alternatively, the epitaxial layer 20 may be deposited on the intrinsic substrate region 12 using the novel chemical vapor deposition (CVD) system and process to be described below with reference to FIG. 3. In any case, it will be understood and appreciated that the broad process novelty herein is not limited to the particular deposition process for forming either the epitaxial layer 20 or the other epitaxial layers to be described herein with reference to both emodiments of our invention.

Figure 1C:
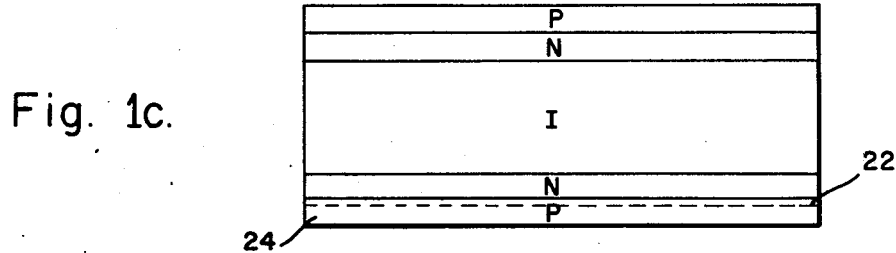

Referring now to FIG. 1c, a second PN junction 22 of the solar cell is formed by the epitaxial deposition of a P type layer 24 of germanium on the N type GaAs layer 20. Preferably, the low temperature CVD process described below with reference to FIG. 3 is utilized in the pyrolytic deposition of the P type epitaxial germanium layer 24. The second PN junction 22 has the bandgap energy of Ge which is separated from the bandgap energy of the first PN junction 18 by about 0.7 electron volts.

Figure 1D:
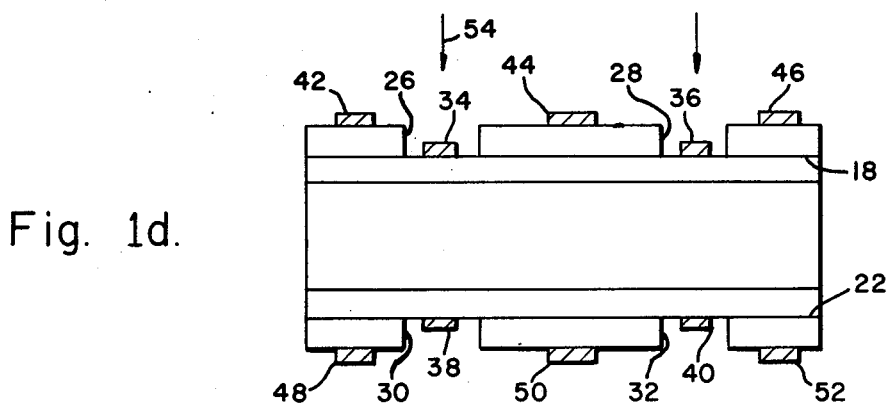

The partially completed solar cell structure of FIG. 1c is then transferred in succession to conventional masking, etching and contact deposition stations wherein the openings 26, 28, 30, and 32 are selectively etched in the outside P type layers 16 and 24 in order to accommodate the ohmic contacts 34, 36, 38, and 40, respectively, to the N type layers 14 and 20. In a similar fashion, ohmic contacts 42, 44, and 46 are provided on the upper surface of the remaining portions or islands of the gallium aluminum arsenide P type layer 16, and lower ohmic contacts 48, 50, and 52 are deposited on the remaining regions of the P type germanium layer 24, as shown in FIG. 1d. Thus, when rays 54 of sunlight impinge on the structure of FIG. 1d, there will be photovoltaic current generation at both the first PN junction 18 and the second PN junction 22.

Figure 2B:
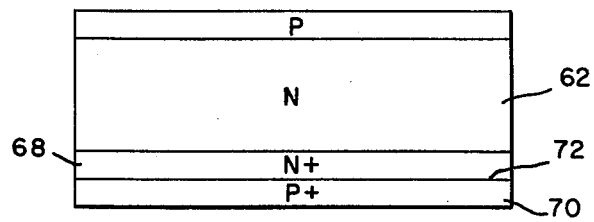
Figure 2C:
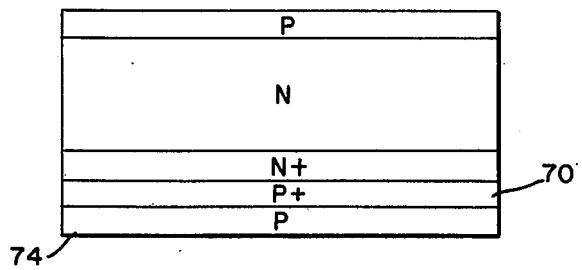
Figure 2D:
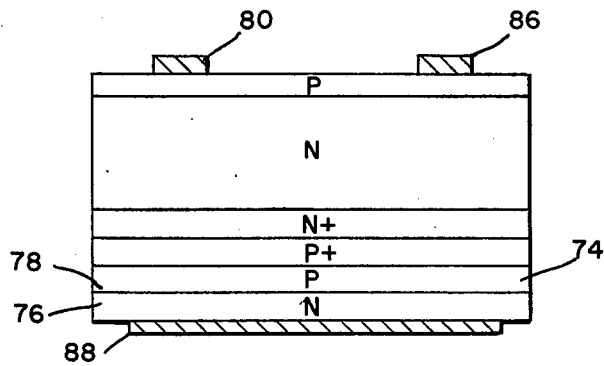

The double solar cell devices shown in FIG. 1d and FIG. 2d to be described are capable of converting from 25-30% of the incident solar energy into electrical power when used in a space application without sunlight concentration, and these devices are capable of converting 35-40% of the incident solar energy into electrical energy when used in a terrestrial application with concentrated sunlight. Thus, for example, in a space application, the gallium aluminum arsenide-gallium arsenide solar cell PN junction 18 on the top side of FIG. 1d is capable of converting about 20% of the solar energy to electrical power, whereas the lower side of the structure containing the gallium arsenide-germanium solar cell PN junction 22 is capable of converting between 5 and 10% of the solar energy into electrical power. Since the number of photons absorbed in the gallium arsenide material from the gallium aluminum arsenide window layer 16 is comparable to the number of photons absorbed in the germanium layer 24, the light generated currents in both the upper and lower portions of the solar cell will be comparable. This will enable the two PN junctions 18 and 22 of the solar cell to operate near their maximum power points even when the two junctions are series connected as in FIG. 2d.

The following Table I lists certain physical and electrical parameters for the various semiconductor layers shown in FIG. 1d, but these values should be considered exemplary in nature and not as limiting the scope of the broad device and process claims for this invention.

TABLE I

| Device Region | Thickness | Impurity Concentration: atoms/cc (Nx) | Resistivity cm) | Bandgap Energy (ev) |
|---|---|---|---|---|
| 12 | 250 m | $10^{17}$/cc | $10^7 \Omega$·cm | 1.4 |
| 14 | 20 m | $10^{17}$/cc | $10^{-2} \Omega$·cm | 1.4 |
| 16 | 1 m | $10^{18}$/cc | $10^{-2} \Omega$·cm | 2.2/2.9* |
| 18 | .5 m | $10^{18}$/cc | $10^{-2} \Omega$·cm | 1.4 |
| 20 | 20 m | $10^{18}$/cc | $10^{-3} \Omega$·cm | 1.4 |
| 22 | .5 m | $10^{18}$/cc | $10^{-2} \Omega$·cm | .66/.8* |
| 24 | 10 m | $10^{17}$/cc | $10^{-1} \Omega$·cm | .66/.8* |

*Indirect gap/direct gap

Thus, the intrinsic gallium arsenide material 12 in FIG. 1d serves to electrically isolate the two PN junctions 18 and 22 of the solar cell structure and enable these PN junctions to be electrically connected, for example, to separate loads. Alternatively, as will be described below with reference to FIGS. 2a–2d, the two PN junctions of the resultant solar cell in FIG. 2d may be connected electrically in series through the various intermediate layers of the cell.

Referring now to FIGS. 2a–2d, there is shown in FIG. 2a a three layer, gallium arsenide-gallium aluminum arsenide structure 60 having a central N type gallium arsenide substrate 62 upon which an upper P type gallium aluminum arsenide layer 64 has been epitaxially deposited to provide a first PN junction 66. An N+ heavily doped gallium arsenide layer 68 is deposited as shown on the opposite surface of the N type substrate 62, and both P and N+ layers 64 and 68 in FIG. 2a may be deposited using either the LPE process of the above-identified Kamath et al. U.S. Pat. No. 4,026,735 or the PRD process described in our U.S. Pat. No. 4,063,974. It is also possible that the original substrate or wafer starting material will be the N+ region 68, while the N doped GaAs layer 62 will be subsequently grown by liquid phase epitaxy (LPE) as a buffer layer on the N+ doped substrate 68. The complete structure 60 in FIG. 2a may have the suggested electrical and physical parameters indicated in Table II below.

Referring now to FIG. 2b, a P+ layer 70 of gallium arsenide is epitaxially deposited on the N+ layer 68, and the P+ layer 70 may be deposited using either the LPE process of the Kamath U.S. Pat. No. 4,026,735, or the PRD process of our U.S. Pat. No. 4,063,974. The heavily doped N+ and P+ layers 68 and 70 define a low resistance, heavily doped PN junction 72 which does not form part of a power generating portion of the cell as a result of the heavy doping concentrations on each side of the PN junction. Instead, the heavily doped P+ and N+ layers 70 and 68 are necessary to provide, by means of a tunnel junction, a low resistance series connection through the interior of the solar cell, while also affording a P+ base layer 70 upon which to pyrolytically deposit a lightly doped P type germanium layer 74, as shown in FIG. 2c. The CVD system of FIG. 3 to be described is preferably used in this latter epitaxial deposition step.

A second, N type germanium layer 76 is then deposited on the P type germanium layer 74, also using the CVD pyrolytic deposition system to be described below with reference to FIG. 3. These P and N type layers 74 and 76 of germanium define the second or auxiliary PN junction 78 of the solar cell structure, and this PN junction 78 is connected electrically in series with the first PN junction 66 and through the low resistivity intermediate P and N layers 70 and 68. The two layers 74 and 76 may be deposited in a single pyrolytic deposition process by suitably controlling the P and N doping levels in the epitaxial deposition chamber of FIG. 3a to be described.

Upper ohmic contacts 80 and 86 are deposited as shown on the upper surface of the gallium aluminum arsenide P type layer 64, and a continuous lower ohmic contact layer 88 is deposited as shown across the surface of the lower N type germanium layer 76. The upper and lower metal contacts of the solar cell structure in FIG. 2d serve to connect the double junction cell to external leads, with both active PN junctions 66 and 78 being used electrically in series. The lower metallic contact 88 of the structure may also function to provide some heat sinking for the solar cell as well as a mechanical bond to a larger solar cell array supporting structure (not shown).

The following Table II lists certain physical and electrical parameters for the various semiconductor layers shown in FIG. 2d, but should be considered exemplary in nature and not as limiting the scope of the broad device or process claims for this invention.

TABLE II

| Device Region | Thickness ($\mu$m) | Impurity Concentration (Nx) | Resistivity $\rho(\Omega \cdot$ cm) | Bandgap Energy (ev) |
|---|---|---|---|---|
| 62 | 200 $\mu$m | $10^{17}$/cc | $10^{-2}$ | 1.4 |
| 64 | 10 $\mu$m | $10^{18}$/cc | $10^{-2}$ | 2.9 |
| 66 | .5 $\mu$m | $10^{18}$/cc | $10^{-2}$ | 1.4 |
| 68 | 1 $\mu$m | $10^{19}$/cc | $4 \times 10^{-4}$ | 1.4 |
| 70 | 1 $\mu$m | $10^{19}$/cc | $6 \times 10^{-3}$ | 1.4 |
| 74 | .5 $\mu$m | $10^{18}$/cc | $10^{-2}$ | .7 |
| 76 | 10 $\mu$m | $10^{17}$/cc | $4 \times 10^{-2}$ | .7 |

Figure 3A:
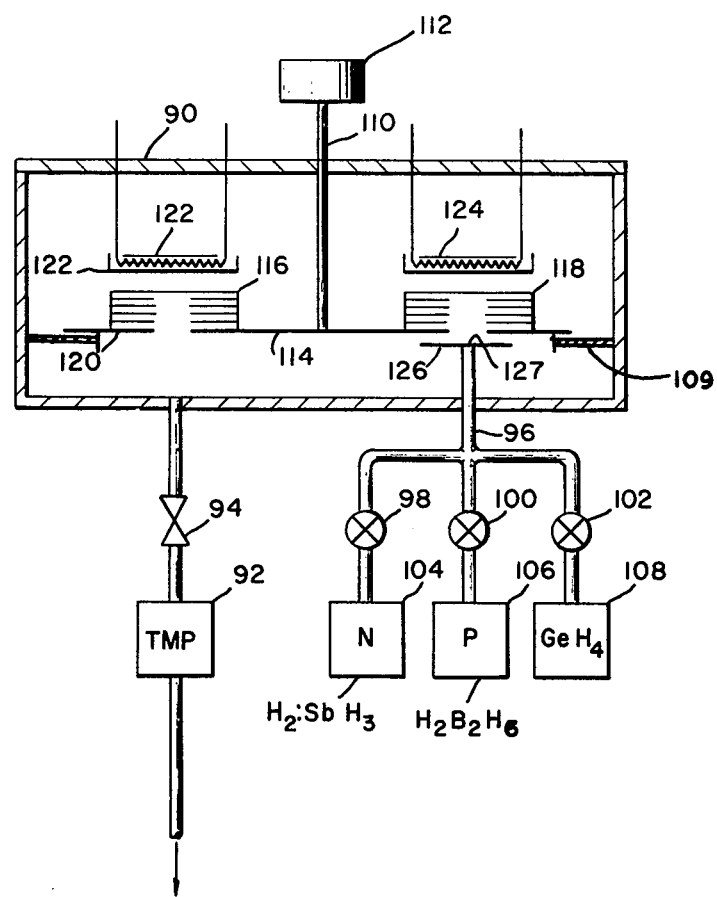
FIG. 3a is a schematic process diagram of a novel chemical vapor deposition (CVD) system suitable for depositing epitaxial layers during the fabrication process to be described.

Referring now to FIG. 3a, there is shown in schematic diagram a vacuum pyrolytic chemical vapor deposition (CVD) system which is useful in the low temperature deposition of any one of the various compound semiconductor or germanium epitaxial layers previously identified. As will be seen, dopant gas flow lines of the CVD system are connected for the pyrolytic deposition of P and N type epitaxial layers of germanium on chosen substrates, but this CVD system can, if desired, be modified by those skilled in the art for the pyrolytic deposition of either gallium arsenide or gallium aluminum arsenide as well.

The system of FIG. 3a includes a main vacuum deposition chamber 90 which is connected to a turbomolecular pump (TMP) 92 by means of a suitable gate valve 94. The pump 92 is capable of pulling vacuums on the chamber 90 of the order of $10^{-10}$ Torr. A gas flow line 96 also extends as shown into the main vacuum chamber 90 and is connected through three gas flow controllers 98, 100, and 102, respectively, to N and P type dopant sources 104 and 106 and to a supply 108 of germane, GeH$_4$. The gaseous compound germane, GeH$_4$, when combined with the appropriate P or N type dopant and heated in the chamber 90 to a suitable elevated temperature such as 500° C. or greater, decomposes in the pyrolysis decomposition chamber 118 in which the substrate wafers are located to produce epitaxial layers of germanium. Thus, P and N type epitaxial layers of germanium may be deposited on selected substrates with controlled levels of impurity doping, and this epitaxial deposition of Ge by the pyrolytic decomposition of germane is defined by the following equation:

$$GeH_4(gas)_{heat} \rightarrow Ge(solid) + 2H_2(gas)$$

A vertical coupling 110 extends as shown between a rotary feedthrough member 112 and a rotary support plate 114. The rotary support plate rests on three bearings 109. Individual CVD pyrolysis chambers 116 and 118 are suitably located and secured at the periphery of the rotary support plate 114, and each CVD chamber 116 and 118 contains multiple horizontal compartments 120 therein for receiving a plurality of single wafer solar cell structures which are ready for epitaxial deposition. The two CVD pyrolysis chambers 116 and 118 are positioned adjacent to controlled heater plates 122 and 124, respectively, and these heater plates are used to bring the CVD pyrolytic deposition temperature up to a desired elevated level, typically on the order of about 525° C. for a corresponding pyrolysis chamber 118 total pressure of about $5 \times 10^{-3}$ Torr.

This total reactant pressure of $5 \times 10^{-3}$ Torr in the chamber 118 can be compared with the residual (impurity) gas pressure in the chamber 118 of about $10^{-8}$ Torr and this in turn will allow the epitaxial deposition of high purity Ge films on the semiconductor substrate. The use of the pyrolytic decomposition chamber 118 within the larger vacuum chamber 90, with its controlled vacuum condition, i.e. $10^{-8}$ Torr residual gas pressure, enables the creation of sufficiently high reactant gas pressures within the chamber 118 ($5 \times 10^{-3}$ Torr) to produce acceptably high Ge film growth rates and sufficiently low to produce highly uniform Ge films on the closely stacked semiconductor substrates.

For these above parameters of temperature and pressure, the epitaxial growth rate of germanium on gallium arsenide substrates will be about 2.0 micrometers per hour. However, higher pressures of $GeH_4$ can be used to obtain faster growth rates for Ge.

Figure 3B:
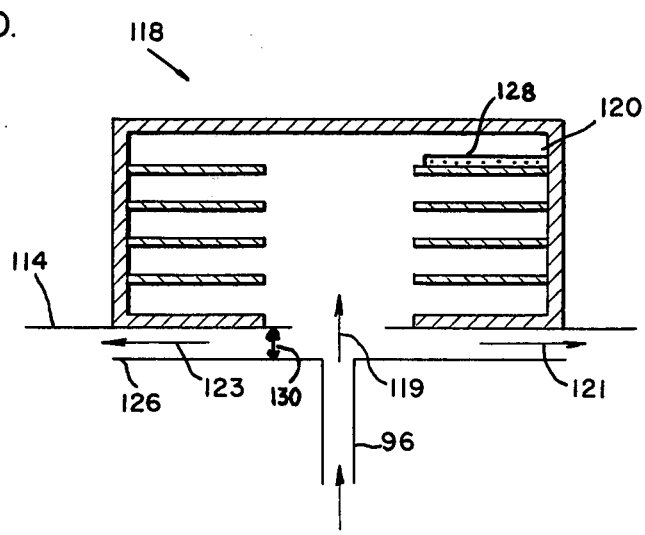

Referring now to FIG. 3b, in conjunction with FIG. 3a, the appropriately doped P or N type germane gas passes through the main gas flow line 96 and into the CVD pyrolysis chamber 118. The $GeH_4$ gas flow will be in the direction of arrows 119, 121 and 123, and the gas traveling the path indicated by the arrow 119 will enter all of the horizontal wafer mount compartments 120 of the pyrolytic decomposition chamber 118. The appropriately doped germane gas will undergo thermal decomposition in these compartments 120 to thereby epitaxially deposit monocrystalline layers of P or N type germanium on the stacked GaAs semiconductor wafers 60, and the gases within the decomposition chamber 118 which do not thermally decompose therein will eventually exit this chamber along the path of the horizontal arrows 121 and 123 as indicated. For a more detailed discussion of the decomposition of germane, $GeH_4$ per se, reference may be made to an article by S. A. Papasian et al., *Journal of the Electrochemical Society*, No. 115, page 965 (1968) and to an article by M. Davis et al., *Journal of Applied Physics*, No. 27, page 835 (1956).

For each molecular surface collision within the decomposition chamber 118, there is a small probability that a $GeH_4$ molecule will react to form a Ge adsorbed atom. Thus, to enhance this probability, pyrolysis chamber pressures of tens of mTorr are desirable. Relative to other prior vacuum pyrolysis systems such as the one disclosed, for example, by B. A. Joyce and R. R. Bradley, Phil. Mag. 14, 289 (1966), this is made possible herein by, inter alia, mounting the chamber 118 as shown on top of the rotary plate 114. The rotary plate 114 is in turn closely spaced from the top plate 126 of the gas inlet line 96 by a small adjustable gap 130. This small gap 130 is typically about 1/16 inch and allows a high pressure ratio to be established between the decomposition chamber 118 and the outer vacuum chamber 90 which surrounds it. Using this mounting arrangement, residual gas pressures in the chamber 118 in the $10^{-8}$ Torr range should be possible.

The $GeH_4$ vacuum process described herein offers several advantages over other prior techniques. Specifically, our process has the advantage of permitting the use of a relatively low semiconductor substrate 128 temperature on the order of about 525° C., and this avoids the potential for the degradation of the GaAs/GaAlAs substrate and the probable occurence of interdiffusion and plastic deformation between adjacent semiconductor layers. The possibility of vapor backetching, which is present in prior methods which utilize halogens, is eliminated. Additionally, since a carrier gas, e.g. $H_2$, is present only at low pressures ($\leq 100$ mTorr), gas impurities in the system can be routinely monitored using a residual gas analyzer. This low carrier gas pressure also allows high wafer stacking densities and uniform coatings, as described for example by R. S. Rosles in *Solid State Technology*, No. 63, (April 1977). These are notable advantages over standard hydrogen transport processes which operate typically at 1 atmosphere of pressure. Furthermore, when the present process is compared to conventional vacuum-evaporation methods, it has the further advantage that contaminants originating from a hot Ge evaporation source are eliminated.

For the positions of the two CVD chambers 116 and 118 shown in FIG. 3a, the CVD chamber 116 is being pre-heated and will, upon completion of the epitaxial depositon of GaAs wafers in the CVD chamber 118, be rotated counter clockwise as indicated to assume the rightside position in the chamber 90 between the plates 124 and 126. This position will be maintained for a predetermined time and at a CVD deposition temperature and appropriate vacuum level within the chamber 90.

The N type dopant in the impurity source 104 may advantageously be introduced into the main gas flow line 96 by the conventional hydrogen transport of one of the Group V hydrides, such as arsine, $AsH_3$, phosphine, $PH_3$ or stibine, $SbH_3$, into the vacuum chamber 90. The P type dopant in the impurity source 106 may be introduced into the main gas flow line 96 by the hydrogen transport of one of the Group III organometallics, such as Ga $(CH_3)_3$, In $(CH_3)_3$ or Al $(CH_3)_3$, or by the hydrogen transport of diborane. For each dopant source 104 and 106, hydrogen gas may be used as a carrier gas to combine the required amount of P or N type impurity with the germane from the source 108.

Finally, it should be noted that this pyrolysis process can be applied to the deposition of GaAs semiconductor layers simply by using $Ga(CH_3)_3$ and $AsH_3$ gases as the main source gases rather than $GeH_4$. Similarly, using appropriate metal organic vapors and hydride gases, a large variety of other semiconducting layers can be fabricated.

Various other modifications may be made in the above-described embodiments without departing from the scope of this invention. For example, the P and N type layers of the solar cells may be reversed, or the device geometry and ohmic contact locations may be changed within the scope of this invention. Additionally, the novel process described herein is not apparatus-limited by the particular film deposition equipment disclosed, and may instead be modified, for example, to utilize a continuous treatment wafer in - wafer out type of epitaxial deposition system. Such a system might include, for example, a conveyor belt which is rigged to enter the left-hand wall of the vacuum chamber 90 and carry a plurality of separate pyrolysis chambers thereon. These individual pyrolysis chambers would then be brought into a particular CVD reaction zone, heated to a desired elevated temperature, and then exposed to the reactant gas streams in much the same manner as described above with reference to FIGS. 3a and 3b. Thereafter, the conveyor belt or other equivalent substrate transport mechanism would carry the treated wafers out of the vacuum deposition chamber and into an auxiliary cooling chamber. Accordingly, it will be understood and appreciated by those skilled in the art that the epitaxial deposition system and apparatus illustrated schematically in FIG. 3a is only one approach to practicing the novel epitaxial deposition process described and claimed herein.

What is claimed is:

1. A multi-junction semiconductor solar cell comprising:
    (a) a gallium arsenide substrate having an outer III-V semiconductor layer thereon establishing a first PN junction of a first bandgap energy equal to that of GaAs,
    (b) an intermediate semiconductor material disposed on the opposite side of said gallium arsenide substrate and doped to provide a given conductivity, and
    (c) a layer of germanium also doped to provide a given conductivity and disposed on said intermediate semiconductor material, said germanium layer defining a second PN junction of a second bandgap energy equal to that of Ge whereby said first and second PN junctions provide an optimized wavelength response to solar energy impinging on said solar cell.

2. The solar cell defined in claim 1 wherein said gallium arsenide substrate is a high resistivity or intrinsic semiconductor material upon which a doped conductive layer of gallium arsenide is disposed, and said outer III-V semiconductor layer is oppositely doped gallium aluminum arsenide disposed on said doped layer of gallium arsenide and forming said first PN junction, whereby said first and second PN junctions are electrically isolated by said intrinsic or high resistivity semiconductor material.

3. The solar cell defined in claim 2 wherein said doped layer of gallium arsenide and said intermediate semiconductor material are N type conductivity GaAs, and said layer of gallium aluminum arsenide and said layer of germanium are P type conductivity.

4. The solar cell defined in claim 1 wherein said gallium arsenide substrate is N type semiconductor material and said outer III-V semiconductor layer is P type gallium-aluminum-arsenide disposed on said gallium arsenide substrate to form said first PN junction, said intermediate semiconductor material includes low resistivity N+ and P+ type semiconductor layers for providing a low resistance series path between said first and second PN junctions, and said second PN junction of said cell is formed by P and N type layers of germanium respectively disposed on said low resistivity semiconductor layers and is connected electrically in series with said first PN junction.

5. A process for fabricating a semiconductor solar cell which comprises the steps of:
    (a) providing a gallium arsenide substrate having an outer III-V semiconductor layer thereon establishing a first PN junction of a first bandgap energy equal to that of GaAs,
    (b) providing an intermediate semiconductor material on the opposite side of said gallium arsenide substrate and doped to provide a given conductivity, and
    (c) providing a layer of germanium doped to provide a given conductivity on said intermediate semiconductor material and defining a second PN junction of a second bandgap energy equal to that of Ge whereby said first and second PN junctions provide an optimized wavelength response to solar energy impinging on said solar cell.

6. The process defined in claim 5 wherein the provision of said gallium arsenide substrate includes providing an intrinsic or high resistivity semiconductor material upon which a conductively doped layer of gallium arsenide is disposed, and wherein said outer III-V semiconductor layer is deposited as an oppositely doped layer of gallium aluminum arsenide on said doped layer of gallium arsenide to form said first PN junction.

7. The process defined in claim 6 wherein said doped layer of gallium arsenide and said intermediate semiconductor material are doped with N type conductivity impurities and said layers of gallium aluminum arsenide and germanium are doped with P type impurities.

8. The process defined in claim 5 wherein said gallium arsenide substrate is provided as a single region of N type semiconductor material upon which said outer III-V semiconductor layer is directly disposed as a layer of P type gallium aluminum arsenide to form said first PN junction, and said intermediate semiconductor material is formed by providing low resistivity N+ and P+ type layers to form by a tunnel junction a low resistance path through said cell; and further providing an additional layer of germanium doped to provide a given conductivity between the first named germanium layer and one of said low resistivity layers of like conductivity to thereby define said second PN junction which is connected electrically in series with said first PN junction.

* * * * *